United States Patent
Wada

(10) Patent No.: US 12,543,532 B2
(45) Date of Patent: Feb. 3, 2026

(54) TRANSPORT VEHICLE

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 277 days.

(21) Appl. No.: 18/386,715

(22) Filed: Nov. 3, 2023

(65) Prior Publication Data

US 2024/0153805 A1    May 9, 2024

(30) Foreign Application Priority Data

Nov. 8, 2022    (JP) .................. 2022-178754

(51) Int. Cl.
*H01L 21/677*    (2006.01)
*B66C 19/00*    (2006.01)
*H01L 21/67*    (2006.01)

(52) U.S. Cl.
CPC .......... *H01L 21/6773* (2013.01); *B66C 19/00* (2013.01); *H01L 21/67259* (2013.01); *H01L 21/67712* (2013.01); *H01L 21/67724* (2013.01); *H01L 21/67733* (2013.01)

(58) Field of Classification Search
CPC ......... B66C 11/00; B66C 11/04; B66C 11/06; B66C 11/12; B66C 19/00; B66C 13/08; B66C 13/16; B66C 13/18; B66C 13/22; B66C 13/46; B66C 1/66; B66C 1/28; B66C 1/42; B65G 1/0457; B65G 35/00; H01L 21/677; H01L 21/67724; H01L 21/67733; H01L 21/6773; H01L 21/67736; H01L 21/67712; H01L 21/68; H01L 21/67259; H01L 21/68707; H01L 21/67379

See application file for complete search history.

(56) References Cited

U.S. PATENT DOCUMENTS

| | | | | |
|---|---|---|---|---|
| 6,099,059 | A  * | 8/2000 | Schultz | ................. B65G 47/90 414/940 |
| 2005/0011851 | A1* | 1/2005 | Ikeya | ................... B66C 13/085 212/331 |
| 2008/0092769 | A1* | 4/2008 | Izumi | ............... H01L 21/68707 105/148 |

(Continued)

FOREIGN PATENT DOCUMENTS

JP    2000012644 A  *  1/2000
JP    2000072378 A  *  3/2000

(Continued)

*Primary Examiner* — Anna M Momper
*Assistant Examiner* — Henrix Soto
(74) *Attorney, Agent, or Firm* — The Webb Law Firm

(57) ABSTRACT

A first container includes a pair of first held sections serving as a pair of held sections, and a second container includes a pair of second held sections serving as a pair of held sections. A first distance between the two first held sections is smaller than a second distance between the two second held sections. A first detector is configured to detect a detection target section in the first held sections and not detect the detection target section in the second held sections while a holder device is disposed at a holding reference position. A second detector is configured to detect a detection target section in the second held sections and not detect the detection target section in the first held sections while the holder device is disposed at the holding reference position.

4 Claims, 7 Drawing Sheets

(56) References Cited

U.S. PATENT DOCUMENTS

| | | | |
|---|---|---|---|
| 2011/0245964 A1* | 10/2011 | Sullivan | H01L 21/68707 700/228 |
| 2013/0220959 A1* | 8/2013 | Won | H01L 21/6773 254/266 |
| 2015/0255318 A1* | 9/2015 | Wada | H01L 21/67265 212/71 |
| 2016/0276191 A1* | 9/2016 | Kinugawa | H01L 21/67259 |
| 2019/0102712 A1* | 4/2019 | Duca | G06Q 10/08 |
| 2020/0013652 A1* | 1/2020 | Kobayashi | B66C 19/00 |
| 2020/0381277 A1* | 12/2020 | Li | B66C 13/18 |

FOREIGN PATENT DOCUMENTS

| | | | | |
|---|---|---|---|---|
| JP | 200564130 A | | 3/2005 | |
| KR | 20070068892 A | * | 7/2007 | H01L 21/67253 |
| KR | 20210091943 A | * | 7/2021 | B65G 47/901 |
| WO | WO-2021181924 A1 | * | 9/2021 | H01L 21/68 |

* cited by examiner

TRANSPORT VEHICLE

CROSS-REFERENCE TO RELATED APPLICATION

This application claims priority to Japanese Patent Application No. 2022-178754 filed Nov. 8, 2022, the disclosure of which is hereby incorporated by reference in its entirety.

BACKGROUND OF THE INVENTION

1. Field of the Invention

The present invention relates to a transport vehicle that travels along a travel path and transports a plurality of types of containers including a first container and a second container.

2. Description of Related Art

For example, JP 2005-064130A (Patent Document 1) discloses a transport vehicle that includes a storage section configured to store a container, a holder device configured to hold the container, and a lift device configured to raise and lower the holder device relative to a transfer target area. The reference numerals in parentheses in the description of the background art below are those of Patent Document 1.

A transport vehicle (1) disclosed in Patent Document 1 transfers a storage container (51) by holding a flange member (53) of the storage container (51) with use of a holder mechanism (32). The holder mechanism (32) has two claw members (33) that open and close by moving in opposite directions. The two claw members (33) are configured to close to support the flange member (53) from below while holding the flange member (53) from two opposite sides.

The storage container (51) to be transferred by the transport vehicle (1) disclosed in Patent Document 1 has only one flange member (53), and the one flange member (53) serves as a held section, i.e. a section held by the holder device of the transport vehicle (1). In this type of field, a container having a pair of held sections may be handled. Further, a plurality of types of containers with different structures, as in the case where two held sections are disposed at different positions, may be handled in the same facility. In this case, it is difficult to hold different types of containers with the same holding operation. It is conceivable to use transport vehicles dedicated to different types of containers, but this would limit the types of containers that one transport vehicle can deal with, which may result in reduced efficiency of container transport in the facility as a whole.

SUMMARY OF THE INVENTION

In view of the foregoing situation, there is a desire to realize a transport vehicle capable of determining the types of different containers and holding the different types of containers.

A technology for solving the above problem is as follows.

A transport vehicle configured to travel along a travel path and transport a plurality of types of containers including a first container and a second container, includes:
  a holder device configured to hold a container, of the plurality of containers;
  a lift device configured to raise and lower the holder device; and
  a determination device configured to determine a type of the container held by the holder device, wherein each of the plurality of containers includes a container body and a pair of held sections protruding upward from an upper face of the container body and configured to be held by the holder device, the first container includes a first container body serving as the container body, and a pair of first held sections serving as the pair of held sections, the second container includes a second container body serving as the container body, and a pair of second held sections serving as the pair of held sections, at least one of the two first held sections includes a detection target section, and at least one of the two second held sections includes a detection target section, the two first held sections are spaced apart from each other in a direction parallel with an upper face of the first container body by a first distance, the two second held sections are spaced apart from each other in a direction parallel with an upper face of the second container body by a second distance, and the first distance is smaller than the second distance, the determination device includes a first detector and a second detector, the first detector is attached to the holder device and configured to, while the holder device is at a holding reference position, detect the detection target section of the at least one of the two first held sections and not detect the detection target section of the at least one of the two second held sections, and the second detector is attached to the holder device and configured to, while the holder device is at the holding reference position, detect the detection target section of the at least one of the two second held sections and not detect the detection target section of the at least one of the two first held sections, the holding reference position being a relative position of the holder device with respect to a target container, which is a container that is to be held, and the holding reference position serving as a reference for the holder device to start a holding operation for the target container.

According to this configuration, it is possible to determine that the target container is the first container in response to the first detector detecting the detection target section of the first held sections while the holder device is disposed at the holding reference position. It is also possible to determine that the target container is the second container in response to the second detector detecting the detection target section of the second held sections while the holder device is disposed at the holding reference position. If it is determined that the target container is the first container, the transport vehicle can appropriately hold the first container by performing a holding operation corresponding to the first distance, which is the distance between the two first held sections. If it is determined that the target container is the second container, the transport vehicle can appropriately hold the second container by performing a holding operation corresponding to the second distance, which is the distance between the two second held sections. As described above, according to this configuration, it is possible to realize a transport vehicle capable of determining the types of different containers and holding the different types of containers.

Further features and advantages of the technique according to the present disclosure will become more apparent in the description of the following exemplary and non-limiting embodiment that will be described with reference to the drawings.

DESCRIPTION OF THE INVENTION

A transport vehicle is configured to travel along a travel path and transport a plurality of types of containers including a first container and a second container. The following is a description of an embodiment of a transport vehicle in an example where the transport vehicle is applied to a transport facility.

Figure 1:
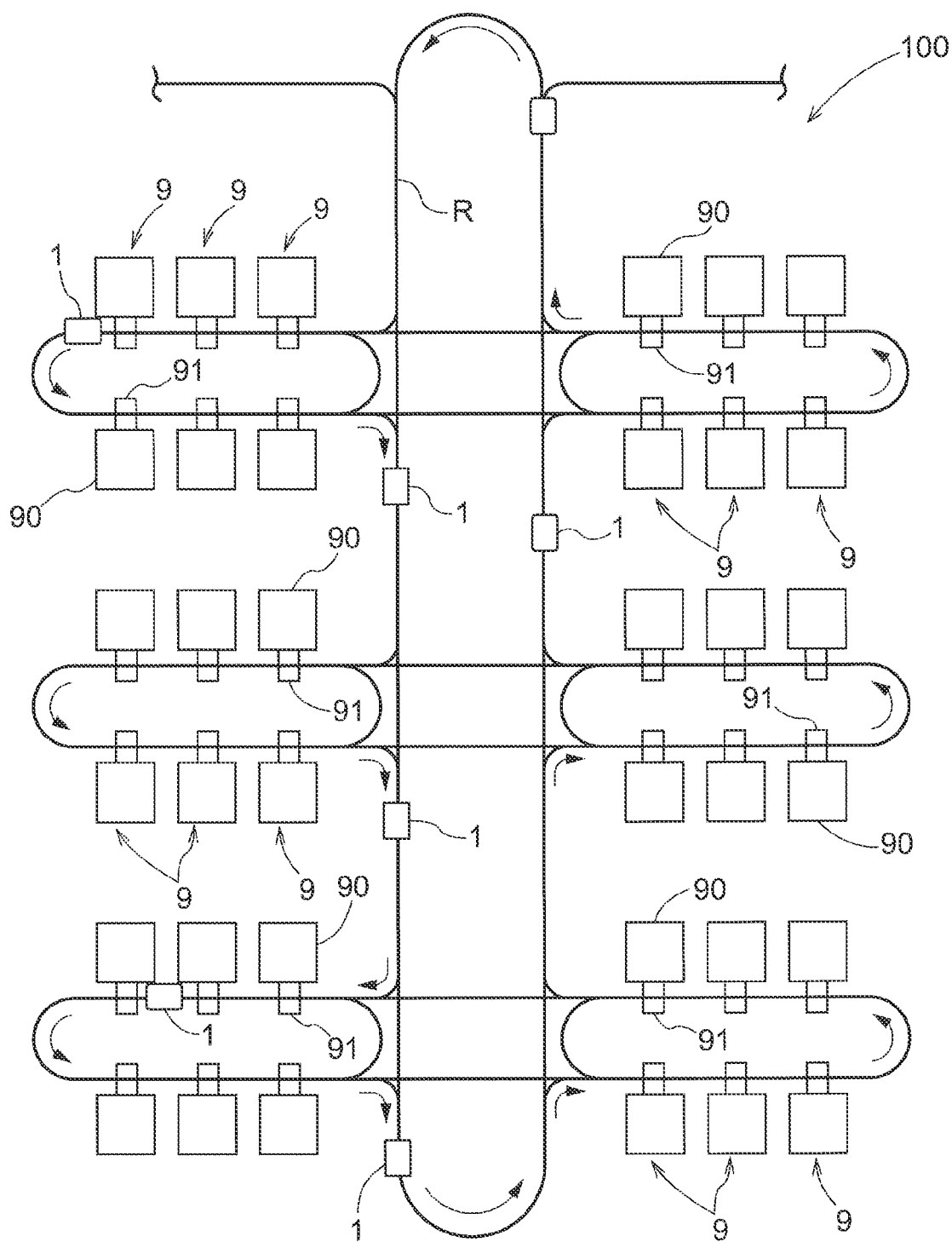
FIG. 1 is a plan view of a transport facility.
Figure 2:
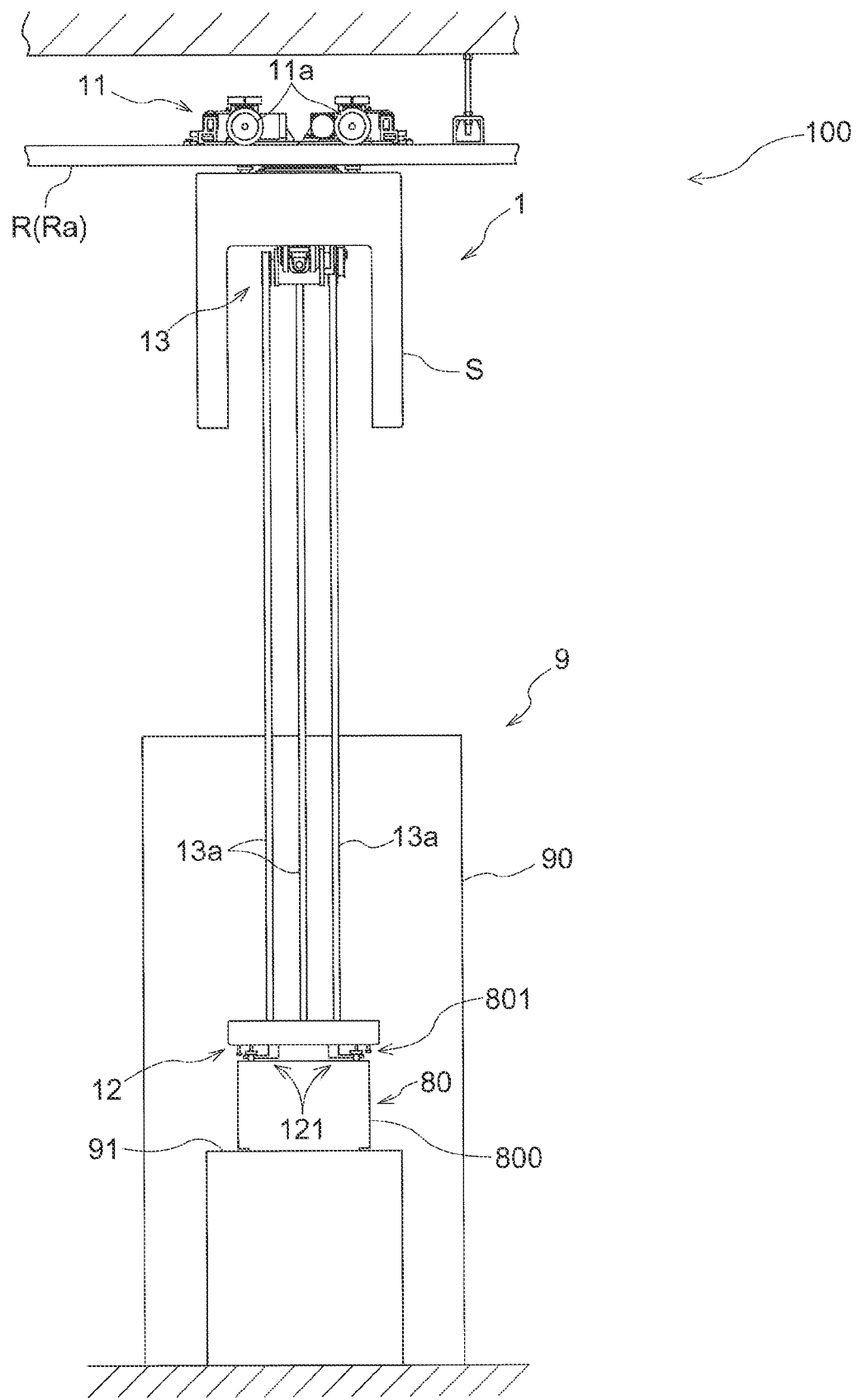
FIG. 2 illustrates a transfer operation.

As shown in FIGS. 1 and 2, a transport facility 100 includes a predetermined travel path R, transport vehicles 1 that travel along the travel path R and transport containers 80, and a plurality of transfer target areas 9 provided along the travel path R.

The travel path R is set at a position spaced upward from a floor surface. The travel path R in this example is constituted by rails Ra provided near a ceiling. Each transport vehicle 1 is configured as a so-called overhead hoist vehicle and travels along the rails Ra. The transfer target areas 9 are disposed below the travel path R. Each transport vehicle 1 transfers a container 80 between the transport vehicle 1 and a transfer target area 9 by raising and lowering the container 80.

The transport facility 100 of this embodiment includes a plurality of transport vehicles 1. Each transport vehicle 1 is configured to receive a transport command from a host control device (not shown) that centrally manages the facility and execute a task corresponding to the transport command. For example, the transport command includes information indicating a transport origin and a transport destination of a container 80. The transport vehicle 1 that has received the transport command transports the container 80 from the transport origin to the transport destination. A transfer target area 9 is included in the transport origin and the transport destination.

The transport facility 100 handles various types of containers 80. The transport facility 100 in this example is used in a semiconductor fabrication plant. Therefore, each container 80 is a substrate storage container (so-called FOUP: Front Opening Unified Pod) for storing a substrate, a reticle storage container (so-called reticle pod) for storing a reticle, or the like. In this case, the transport vehicle 1 transports the container 80, which is a substrate storage container, a reticle storage container, or the like, between processes along the travel path R.

Each transfer target area 9 of this embodiment includes a processing device 90 for processing the container 80 and a support section 91 disposed adjacent to the processing device 90. The term "processing the container 80" herein means processing a stored object (e.g. substrate or a reticle), namely an object stored in the container 80. The transport vehicle 1 receives a container 80 that has been subjected to processing by the processing device 90 from the support section 91 or delivers a container 80 that has not yet been subjected to processing by the processing device 90 to the support section 91. Note that the processing device 90 performs various types of processing, such as thin film formation, photolithography, and etching.

The transport vehicle 1 includes a travel device 11 for traveling on the rails Ra and a storage section S for storing the container 80, as shown in FIG. 2. The transport vehicle 1 travels on the rails Ra by means of the travel device 11 with the container 80 stored in the storage section S. The transport vehicle 1 thus transports the container 80 to the transport destination designated by the transport command.

Figure 5:
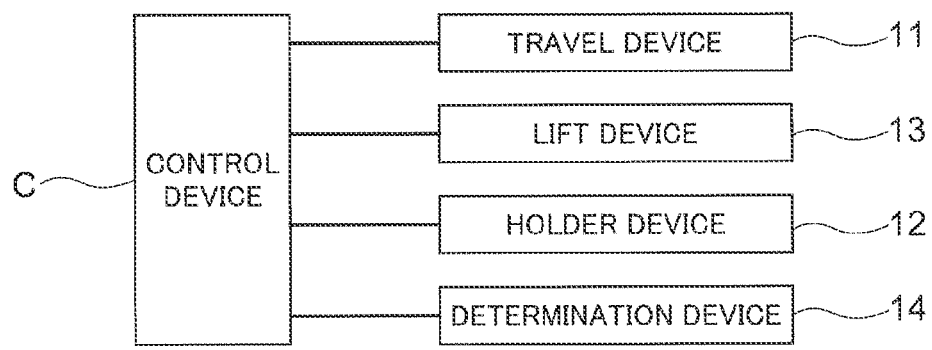
FIG. 5 is a control block diagram.

The transport vehicle 1 also includes a holder device 12 for holding the container 80 and a lift device 13 for raising and lowering the holder device 12. The holder device 12 holds a held section 801 of the container 80. The lift device 13 raises and lowers the holder device 12 between the storage section S and a transfer target area 9 disposed below the travel path R. The transport vehicle 1 of this embodiment also includes a control device C (see FIG. 5) that controls the holder device 12 and the lift device 13. Note that the control device C is also configured to control the travel device 11.

The travel device 11 of this embodiment includes a plurality of travel wheels 11a that roll on the rails Ra, and a travel driver (e.g. electric motor etc.) that drives at least some of the travel wheels 11a.

The storage section S of this embodiment is suspended from and supported by the travel device 11 and disposed below the rails Ra. The storage section S is configured to store a container 80 held by the holder device 12. The container 80 is stored in the storage section S while the transport vehicle 1 transports the container 80 along the travel path R.

The holder device 12 of this embodiment includes a plurality of holder bodies 121 and a holder drive mechanism 12m (see FIGS. 6 and 7) that drives the plurality of holder bodies 121. For example, the holder drive mechanism 12m includes a mechanism for causing the holder bodies 121 to perform a holding operation, and a drive source (e.g. electric motor etc.) for applying driving force to the holder bodies 121. Details of the holder device 12 will be described later.

The lift device 13 of this embodiment includes lift belts 13a connected to the holder device 12, and a lift drive unit that drives the lift belts 13a. While not shown in detail, the lift drive unit includes a rotary body around which the lift belts 13a are wound, and a drive source (e.g. electric motor etc.) that rotates the rotary body. The lift belts 13a are wound up or unwound as a result of the rotary body rotating forward or in reverse. Thus, the holder device 12 connected to the lift belts 13a is raised and lowered.

Next, the container 80 will be described. The container 80 is for storing an object to be stored, as mentioned above.

Figure 3:
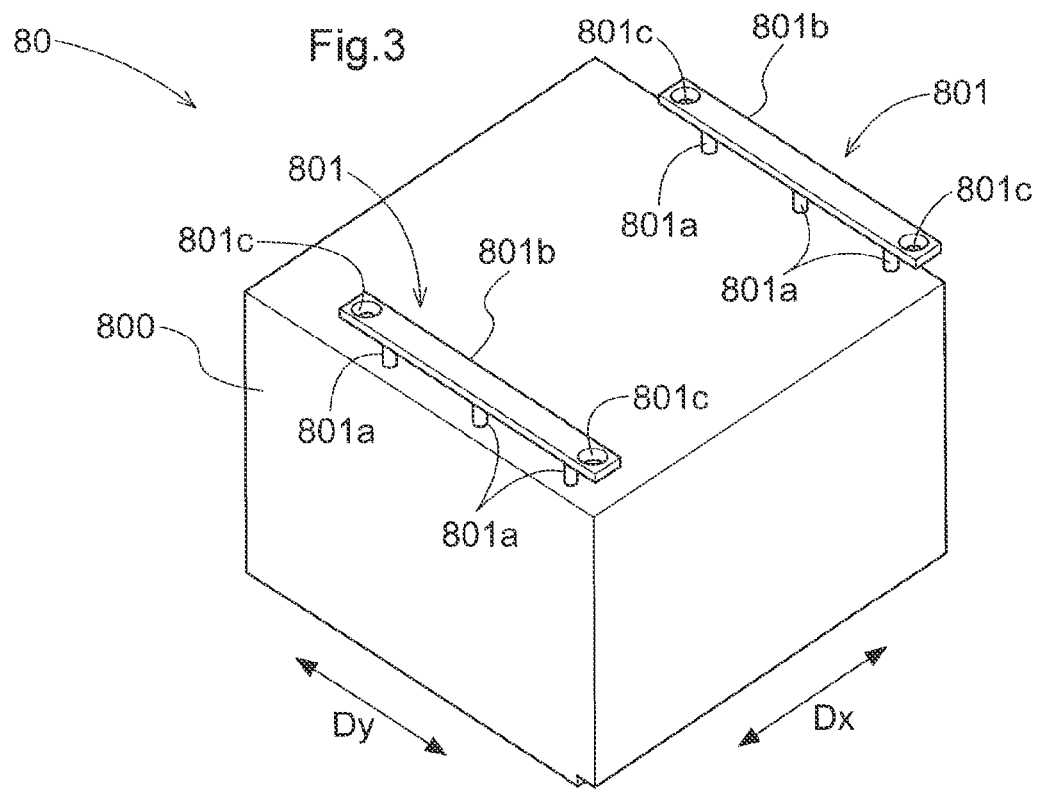
FIG. 3 is a perspective view of a container.

The container 80 includes a container body 800 and a pair of held sections 801 that protrude upward from an upper face of the container body 800 and are to be held by the holder device 12, as shown in FIG. 3. The container body 800 is a section in which the object to be stored is stored, and has a box shape. The two held sections 801 are spaced apart from each other in an arrangement direction Dx.

Herein, when each of the two held sections 801 of the container 80 (target container 80) is referred to as a target held section 801, the arrangement direction Dx refers to the direction in which the two target held sections 801 are arranged next to each other. A direction orthogonal to the arrangement direction Dx as viewed in the up-down direction is referred to as an orthogonal direction Dy.

In this embodiment, each of the two held sections 801 includes a plurality of columns 801a extending from the upper face of the container body 800, and a plate-shaped section 801b connecting upper ends of the columns 801a to each other.

The columns 801a constituting one held section 801 are spaced apart from each other in the orthogonal direction Dy. In the shown example, three columns 801a are disposed at equal distances from each other. Although this will be described in detail later, the distance between two adjacent columns 801a is such that one holder body 121 of the holder device 12 can pass therebetween.

The plate-shaped section 801b is elongated in the direction (orthogonal direction Dy) in which the columns 801a are arranged next to each other. The plate-shaped section 801b has positioning recessed sections 801c, which are recessed downward from an upper face of the plate-shaped section 801b. The plate-shaped section 801b has a plurality of (two in the shown example) positioning recessed sections 801c. Although this will be described in detail later, positioning sections 122 of the holder device 12 are fitted into the corresponding positioning recessed sections 801c when the holder device 12 holds the held section 801.

Figure 6:
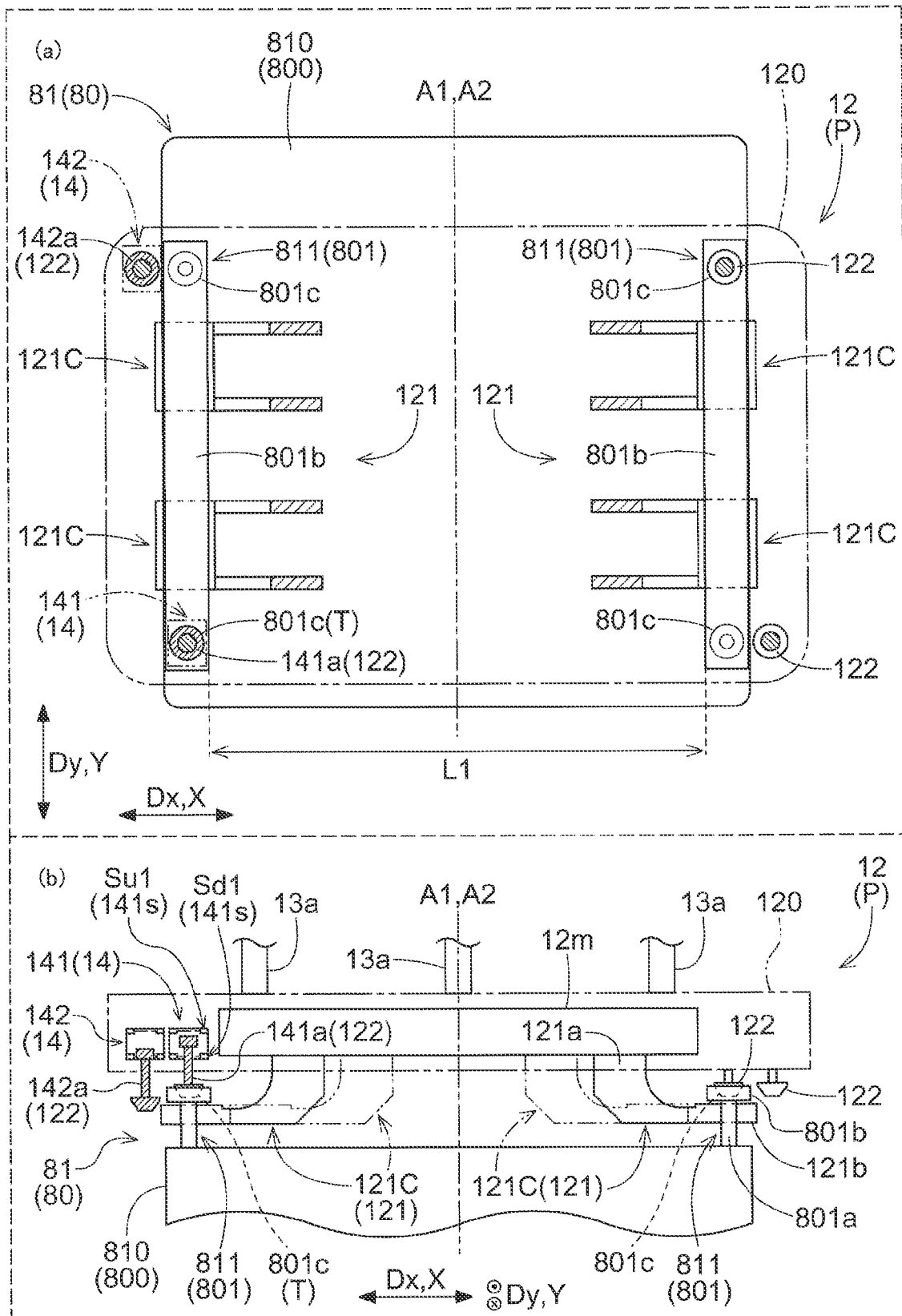
FIG. 6 shows a determination device determining a first container.
Figure 7:
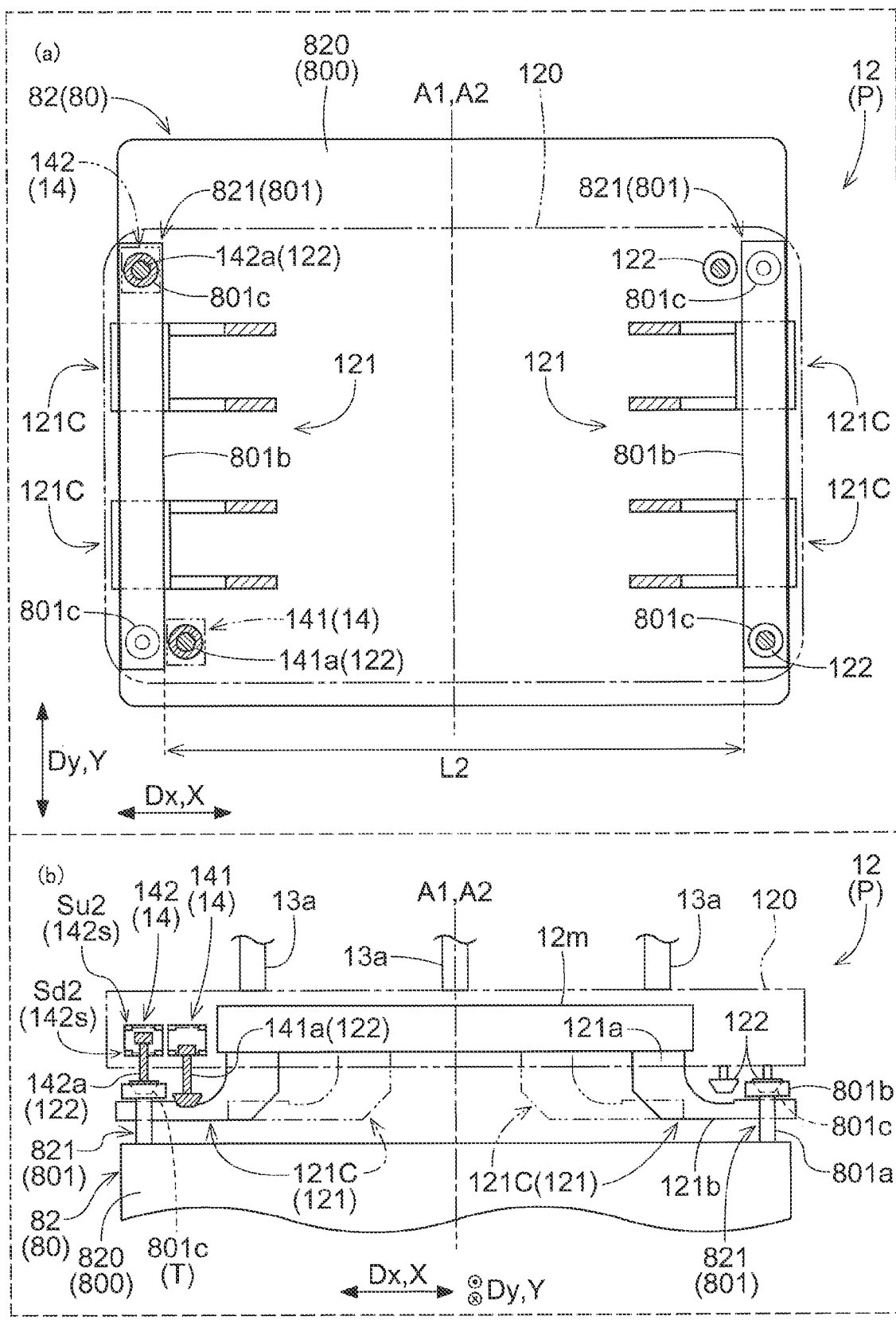
FIG. 7 shows the determination device determining a second container.

The transport facility 100 handles a plurality of types of containers 80, as shown in FIGS. 6 and 7. The plurality of types of containers 80 includes a first container 81 and a second container 82.

The first container 81 and the second container 82 have the same main constituents. That is, the first container 81 includes a first container body 810 serving as the container body 800, and a pair of first held sections 811 serving as the pair of held sections 801. The second container 82 includes a second container body 820 serving as the container body 800, and a pair of second held sections 821 serving as the pair of held sections 801.

The first container 81 and the second container 82 differ in configuration on a finer level. Specifically, the relative positions of the two held sections 801 provided on the container body 800 are different. That is, a first distance L1 (see FIG. 6), which is the distance between the two first held sections 811 in a direction parallel with the upper face of the first container body 810, is smaller than a second distance L2 (see FIG. 7), which is the distance between the two second held sections 821 in a direction parallel with the upper face of the second container body 820. The first distance L1 is the distance between the two first held sections 811 in the arrangement direction Dx. The second distance L2 is the distance between the two second held sections 821 in the arrangement direction Dx. Note that the first container body 810 and the second container body 820 also differ in size, and therefore the containers 80 can store objects to be stored with different types and sizes, for example.

Figure 4:
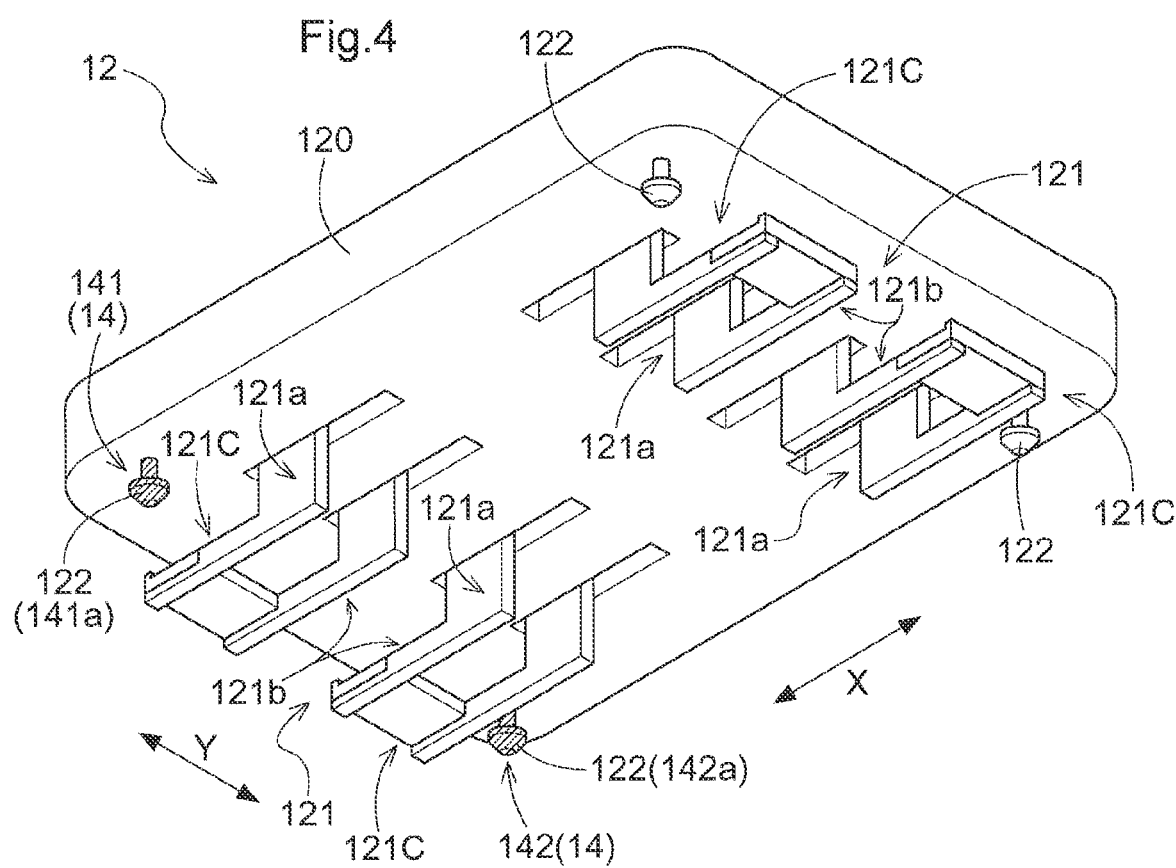
FIG. 4 is a perspective view of a holder device from below.

FIG. 4 is a perspective view of the holder device 12 from below. In FIG. 4, a first direction X is a specific direction parallel with the horizontal direction, and a second direction Y is a direction orthogonal to the first direction X as viewed in the up-down direction.

The holder device 12 has the pair of holder bodies 121 and the holder drive mechanism 12m (see FIGS. 6 and 7) that moves the pair of holder bodies 121 closer to and away from each other in a holding operation direction, which is parallel with the horizontal direction, as shown in FIG. 4. The holding operation direction herein is equivalent to the first direction X.

The holder device 12 of this embodiment includes a holder main body 120 and a plurality of positioning sections 122. The pair of holder bodies 121 and the plurality of positioning sections 122 are supported by the holder main body 120 and protrude downward from the holder main body 120. Note that the aforementioned lift belts 13a are connected to the holder main body 120 (see FIGS. 6 and 7).

The holder device 12 of this embodiment includes four positioning sections 122. Two of the four positioning sections 122 are disposed at positions corresponding to positioning recessed sections 801c provided in the pair of first held sections 811. The other two of the four positioning sections 122 are disposed at positions corresponding to positioning recessed sections 801c provided in the pair of second held sections 821.

Each of the two holder bodies 121 includes a plurality of holder claws 121C. In this example, each of the two holder bodies 121 has a pair of holder claws 121C. The two holder claws 121C included in one holder body 121 are disposed at the same position in the first direction X (holding operation direction) and spaced apart from each other in the second direction Y (a direction orthogonal to the holding operation direction as viewed in the up-down direction). The two holder claws 121C extend into the holder main body 120 and are integrated with each other inside the holder main body 120. Accordingly, the pair of holder claws 121C operate integrally.

Each holder claw 121C of this embodiment has a base section 121a that is supported by and extends downward from the holder main body 120, and an extension section 121b that extends outward in the horizontal direction from the base section 121a. Each holder claw 121C in this example has a substantially L-shape in a side view (as viewed in the second direction Y).

A "holding reference position P" refers to a relative position of the holder device 12 with respect to the target container 80 that serves as a reference for the holder device 12 to start the holding operation for the target container 80, namely the container 80 to be held, as shown in FIGS. 6 and 7. "Target held sections 801" refer to the held sections 801 of the target container 80.

The two holder bodies 121 of this embodiment are disposed between the two target held sections 801 while the holder device 12 is disposed at the holding reference position P. The two holder bodies 121 are then configured to hold the two held sections 801 from the inner side in the arrangement direction Dx by moving away from each other in the holding operation direction between the two target held sections 801.

Here, the extension section 121b of each holder claw 121C passes between two corresponding adjacent columns 801a and is disposed at a position facing the corresponding plate-shaped section 801b from below. Upon the entire holder device 12 being raised in this state, the supporter of the target container 80 shifts from the support section 91 (see FIG. 2) to the holder device 12, and the extension section 121b of each holder claw 121C raises the plate-shaped section 801b from below. Conversely, upon the entire holder device 12 being lowered from the state where the extension section 121b of each the holder claw 121C is raising the plate-shaped section 801b, the supporter of the target container 80 shifts from the holder device 12 to the support section 91 (see FIG. 2), and the extension section 121b of each holder claw 121C moves downward away from the plate-shaped section 801b.

A central position A1 between the two holder bodies 121 coincides (or substantially coincides) with a central position A2 between the two target held sections 801 while the holder device 12 is disposed at the holding reference position P. Further, in this embodiment, the extension sections 121*b* are disposed at a height above the container body 800 and below the plate-shaped sections 801*b* while the holder device 12 is disposed at the holding reference position P. The holder device 12 is able to hold and release the pair of target held sections 801 by thus being disposed at the holding reference position P. That is, the holder device 12 holds the pair of held sections 801 by moving the two holder bodies 121 away from each other while the holder device 12 is disposed at the holding reference position P. Conversely, the holder device 12 releases the held sections 801 by moving the pair of holder bodies 121 closer to each other. Operations of the pair of holder bodies 121 are realized by the holder drive mechanism 12*m* provided inside the holder main body 120.

The plurality of positioning sections 122 of this embodiment protrude downward from the holder main body 120. The positioning sections 122 are located at positions corresponding to the respective positioning recessed sections 801*c* provided in the held sections 801 of the container 80. Each positioning section 122 is configured to be fitted into a corresponding positioning recessed section 801*c*, at least while the holder device 12 is holding the pair of held sections 801. For the transport vehicle 1 to receive a container 80 placed on the support section 91, the plurality of positioning sections 122 are fitted into the respective positioning recessed sections 801*c* as the holder device 12 is lowered to the support section 91. That is, the positioning sections 122 are fitted into the respective positioning recessed sections 801*c* before the holder device 12 holds the pair of held sections 801. Thus, each of the two holder bodies 121 is positioned at an appropriate position relative to the corresponding held section 801. Thereafter, the pair of held sections 801 can be appropriately held by causing the pair of holder bodies 121 to operate.

Here, the first container 81 and the second container 82 differ in configuration on a finer level, as mentioned above. That is, the first distance L1 (see FIG. 6), which is the distance between the two first held sections 811, is smaller than the second distance L2 (see FIG. 7), which is the distance between the two second held sections 821.

The transport vehicle 1 according to the present disclosure is capable of holding both the first container 81 and the second container 82 that have different configurations. Details thereof are described below.

The transport vehicle 1 includes a determination device 14 that determines the type of each container 80 held by the holder device 12. The transport vehicle 1 uses the determination device 14 to determine the type of each container 80 before holding the container 80. After determining the type of the target container 80, which is the container 80 to be held, the transport vehicle 1 performs a holding operation to hold the target container 80 in accordance with the determined type. The control device C of this embodiment controls the determination device 14. Note that the control device C also controls the travel device 11, the holder device 12, and the lift device 13, as mentioned above.

To cause the holder device 12 to hold the target container 80 that is supported by the support section 91 (see FIG. 2) disposed below the travel path R, the control device C of this embodiment lowers the holder device 12 to the holding reference position P such that the two holder bodies 121 are disposed between the two target held sections 801 and the holding operation direction (first direction X in this example) is parallel with the arrangement direction Dx of the target held sections 801, and causes the determination device 14 to determine the type of the target container 80, as shown in FIGS. 6 and 7. The control device C then controls the amount of movement of the pair of holder bodies 121 in the holding operation direction based on the determination results obtained by the determination device 14. The control device C of this embodiment moves the two holder bodies 121 away from each other such that the distance between the two holder bodies 121 in the holding operation direction corresponds to the distance between the two target held sections 801.

The determination device 14 includes a first detector 141 and a second detector 142. The first detector 141 and the second detector 142 of this embodiment are provided in the holder device 12. The determination device 14 detects the first container 81 with use of the first detector 141, and detects the second container 82 with use of the second detector 142.

The first held section 811 of the first container 81 and the second held section 821 of the second container 82 each have a detection target section T. The detection target section T is a portion of the target held section 801 that is to be detected by the first detector 141 or the second detector 142. In this example, the first detector 141 detects the detection target section T provided in the first held sections 811. The second detector 142 detects the detection target section T provided in the second held sections 821.

The detection target section T of this embodiment is one of the positioning recessed sections 801*c* provided in the upper faces of the first held sections 811 and the second held sections 821 (specifically, upper faces of the plate-shaped sections 801*b*).

In this embodiment, at least one of the plurality of positioning recessed sections 801*c* provided in the pair of first held sections 811 of the first container 81 is the detection target section T that is to be detected by the first detector 141. In the example shown in FIG. 6, one of the four positioning recessed sections 801*c* provided in the pair of first held sections 811 is the detection target section T that is to be detected by the first detector 141. The first detector 141 is disposed at a position overlapping the detection target section T (positioning recessed section 801*c*) of the first held sections 811 as viewed in the up-down direction while the holder device 12 is disposed at the holding reference position P.

In this embodiment, at least one of the plurality of positioning recessed sections 801*c* provided in the pair of second held sections 821 of the second container 82 is the detection target section T that is to be detected by the second detector 142. In the example shown in FIG. 7, one of the four positioning recessed sections 801*c* provided in the pair of second held sections 821 is the detection target section T that is to be detected by the second detector 142. The second detector 142 is disposed at a position overlapping the detection target section T (positioning recessed section 801*c*) of the second held sections 821 as viewed in the up-down direction while the holder device 12 is disposed at the holding reference position P.

The first detector 141 is configured to detect the detection target section T of the first held sections 811 and not detect the detection target section T of the second held sections 821 while the first detector 141 is attached to the holder device 12 that is disposed at the holding reference position P.

The first detector 141 of this embodiment is disposed at a position overlapping the detection target section T (positioning recessed section 801*c*) of the first held sections 811 and not overlapping the detection target section T of the second held sections 821 (see FIG. 7) as viewed in the up-down direction while the holder device 12 is disposed at the holding reference position P, as shown in FIG. 6.

The second detector 142 is configured to detect the detection target section T of the second held sections 821 and not detect the detection target section T of the first held sections 811 while the second detector 141 is attached to the holder device 12 that is disposed at the holding reference position P.

The second detector 142 of this embodiment is disposed at a position overlapping the detection target section T (positioning recessed section 801c) of the second held sections 821 and not overlapping the detection target section T of the first held sections 811 (see FIG. 6) as viewed in the up-down direction while the holder device 12 is disposed at the holding reference position P, as shown in FIG. 7.

The first detector 141 is disposed on the same side as the second detector 142 in the holding operation direction (first direction X) relative to the central position A1 between the two holder bodies 121 serving as a reference, as shown in FIG. 6. The first detector 141 is disposed on the inner side (central position A1 side) of the second detector 142 in the holding operation direction (first direction X).

The first detector 141 of this embodiment includes a first detector body 141a that is supported so as to be movable in the up-down direction relative to the holder device 12, and a first sensor 141s that detects up-down movement of the first detector body 141a.

In this embodiment, at least one of the plurality of positioning sections 122 of the holder device 12 serves as the first detector body 141a. The holder device 12 in this example has four positioning sections 122 as mentioned above, and one of the four positioning sections 122 serves as the first detector body 141a.

The bottom of the holder main body 120 has a hole section (not shown) that is open to the inside and outside of the holder main body 120. The first detector body 141a extends through the hole section.

The hole section guides the first detector body 141a so as to be movable in the up-down direction, and restrains the first detector body 141a from moving in the horizontal direction. Thus, the first detector body 141a is movable in the up-down direction relative to the holder main body 120 while being restrained from moving in the horizontal direction.

The entire holder device 12 being lowered by the lift device 13 causes the first detector body 141a to come into contact with the detection target section T (positioning recessed section 801c) of the first held sections 811 before the holder device 12 is disposed at the holding reference position P. The holder device 12 being further lowered causes the first detector body 141a to move upward relative to the holder main body 120 and be pushed into the holder main body 120. Then, the holder device 12 is disposed at the holding reference position P as a result of further continuing to be lowered.

While the holder device 12 is disposed at the holding reference position P, the first detector body 141a is disposed at a position where the first detector body 141a is fitted into the positioning recessed section 801c of the first held sections 811 from above and does not come into contact with the second held sections 821 (see FIG. 7 also). The holder device 12 is positioned relative to the first held sections 811 as a result of the first detector body 141a being fitted into the positioning recessed section 801c.

The first sensor 141s is provided within the holder main body 120. The first sensor 141s detects whether or not the first detector body 141a is in the positioning recessed section 801c (detection target section T) based on up-down movement of the first detector body 141a. If the first sensor 141s detects that the first detector body 141a is in the positioning recessed section 801c, it is assumed that the first detector 141 has detected the detection target section T of the first held sections 811.

The first sensor 141s of this embodiment includes a light emitter-receiver (later-described lower light emitter-receiver Sd1) that has a light emitter and a light receiver, and is configured to detect the state of the first detector body 141a based on whether or not the optical axis of the first sensor 141s is blocked. In a normal state where the first detector body 141a is not in contact with the detection target section T, the optical axis of the first sensor 141s is blocked by a portion of the first detector body 141a. The optical axis of the first sensor 141s is unblocked (i.e. the light receiver receives light from the light emitter) as a result of the first detector body 141a being pushed by the detection target section T of the first held sections 811 and protruding into the holder main body 120. The first sensor 141s thus detects that the first detector body 141a is in the positioning recessed section 801c (detection target section T).

The first sensor 141s of this embodiment detects that the holder device 12 is located at a lower limit based on up-down movement of the first detector body 141a. The holder device 12 being disposed at the lower limit refers to a state where the holder device 12 has been further lowered than in the state shown in FIG. 6, i.e. a state where the extension sections 121b of the holder bodies 121 are adjacent to the first container body 810 with a small gap therebetween (or in contact with the first container body 810). If the holder device 12 is lowered beyond the lower limit, the extension sections 121b of the holder bodies 121 may come into strong contact with the first container body 810, which may result in a transfer error. Therefore, the control device C causes the lift device 13 to stop lowering the holder device 12 in response to the first sensor 141s detecting that the holder device 12 is located at the lower limit.

The first sensor 141s of this embodiment includes a lower light emitter-receiver Sd1 and an upper light emitter-receiver Su1 disposed above the lower light emitter-receiver Sd1. It is detected that the first detector body 141a is in the positioning recessed section 801c (detection target section T) based on whether or not the optical axis is blocked at the lower light emitter-receiver Sd1. It is detected that the holder device 12 is located at the lower limit based on whether or not the optical axis is blocked at the upper light emitter-receiver Su1. In this example, a portion of the first detector body 141a blocks the optical axis of the upper light emitter-receiver Su1 in response to the protrusion amount of the first detector body 141a relative to the interior of the holder main body 120 reaching a predetermined set amount. The aforementioned set amount is determined as appropriate depending on the relationship between the first detector body 141a and the lower limit of the holder device 12.

Thus, the control device C determines that the target container 80 is the first container 81 and detects that the holder device 12 is located at the lower limit relative to the first container 81, with use of the first detector 141.

As described above, the holder device 12 of this embodiment includes four positioning sections 122 that are disposed in correspondence with the pair of first held sections 811 and the pair of second held sections 821. One of the four positioning sections 122 serves as the first detector body 141a. If the target container 80 is the first container 81, the first detector body 141a is fitted into the positioning recessed section 801c (detection target section T) of the first held sections 811. In this example, of the four positioning sections 122, the positioning section 122 disposed at a position diagonal to the first detector body 141a as viewed in the up-down direction is fitted into a positioning recessed section 801c in the first held section 811 different from the first held section 811 that has the positioning recessed section 801c (detection target section T) into which the first detector body 141a is fitted, as shown in FIG. 6(a). That is, the holder device 12 is positioned relative to the first container 81 by two positioning sections 122 that are diagonal to each other as viewed in the up-down direction, of the four positioning sections 122. One of these two positioning sections 122 serves as the first detector body 141a and detects that the target container 80 is the first container 81.

If it is determined that the target container 80 is the first container 81, the control device C causes the holder drive mechanism 12m to move the two holder bodies 121 away from each other until the distance therebetween corresponds to the first distance L1. As a result, the extension sections 121b of the pair of holder claws 121C are disposed below the plate-shaped sections 801b of the pair of first held sections 811.

After moving the two holder bodies 121 away from each other until the distance therebetween corresponds to the first distance L1, the control device C causes the lift device 13 to raise the holder device 12. The pair of holder bodies 121 thus raises the pair of first held sections 811 from below. Then the holder device 12 completes holding of the first container 81.

In this embodiment, while the holder device 12 is holding the pair of first held sections 811 of the first container 81, the first detector 141 detects the detection target section T in the first held sections 811, and the second detector 142 does not detect the detection target section T in the first held sections 811. This allows the determination device 14 to determine that the target container 80 is the first container 81, even while the holder device 12 is holding the target container 80. Accordingly, it is always possible to reference the determination results obtained by the determination device 14 while the holder device 12 is holding the target container 80 without the need to store the type of the held container 80 after the holder device 12 holds the target container 80. These determination results can be used, for example, for a transport operation to transport the target container 80, a lifting operation to raise and lower the target container 80, and a releasing operation to release the held target container 80.

The second detector 142 is disposed on the same side as the first detector 141 in the holding operation direction (first direction X) relative to the central position A1 between the two holder bodies 121 serving as a reference, as shown in FIG. 7. The second detector 142 is disposed on the outer side of the first detector 141 in the holding operation direction (first direction X) (i.e. on the side opposite to the center position A1 side).

The second detector 142 of this embodiment includes a second detector body 142a that is supported so as to be movable in the up-down direction relative to the holder device 12, and a second sensor 142s that detects up-down movement of the second detector body 142a.

In this embodiment, at least one of the plurality of positioning sections 122 of the holder device 12 serves as the second detector body 142a. The holder device 12 in this example has four positioning sections 122 as mentioned above, and one of the four positioning sections 122 serves as the second detector body 142a.

In this embodiment, the bottom of the holder main body 120 has a hole section (not shown) that is open to the inside and outside of the holder main body 120. The second detector body 142a extends through the hole section. The hole section guides the second detector body 142a so as to be movable in the up-down direction, and restrains the second detector body 142a from moving in the horizontal direction. Thus, the second detector body 142a is movable in the up-down direction relative to the holder main body 120 while being restrained from moving in the horizontal direction.

The entire holder device 12 being lowered by the lift device 13 causes the second detector body 142a to come into contact with the detection target section T (positioning recessed section 801c) of the second held sections 821 before the holder device 12 is disposed at the holding reference position P. The holder device 12 being further lowered causes the second detector body 142a to move upward relative to the holder main body 120 and be pushed into the holder main body 120. Then, the holder device 12 is disposed at the holding reference position P as a result of further continuing to be lowered.

While the holder device 12 is disposed at the holding reference position P, the second detector body 142a is disposed at a position where the second detector body 141a is fitted into the positioning recessed section 801c of the second held sections 821 from above and does not come into contact with the first held sections 811 (see also FIG. 6). The holder device 12 is positioned relative to the second held sections 821 as a result of the second detector body 142a being fitted into the positioning recessed section 801c.

The second sensor 142s is provided within the holder main body 120. The second sensor 142s detects whether or not the second detector body 142a is in the positioning recessed section 801c based on up-down movement of the second detector body 142a. If the second sensor 142s detects that the second detector body 142a is in the positioning recessed section 801c, it is assumed that the second detector 142 has detected the detection target section T of the second held sections 821.

The second sensor 142s of this embodiment includes a light emitter-receiver (later-described lower light emitter-receiver Sd2) that has a light emitter and a light receiver, and is configured to detect the state of the second detector body 142a based on whether or not the optical axis of the second sensor 142s is blocked. In a normal state where the second detector body 142a is not in contact with the detection target section T, the optical axis of the second sensor 142s is blocked by a portion of the second detector body 142a. The optical axis of the second sensor 142s is unblocked (i.e. the light receiver receives light from the light emitter) as a result of the second detector body 142a being pushed by the detection target section T of the second held sections 821 and protruding into the holder main body 120. Thus, the second sensor 142s detects that the second detector body 142a is in the positioning recessed section 801c (detection target section T).

The second sensor 142s of this embodiment detects that the holder device 12 is located at a lower limit based on up-down movement of the second detector body 142a. The holder device 12 being disposed at the lower limit refers to a state where the holder device 12 has been further lowered than in the state shown in FIG. 7, i.e. a state where the extension sections 121b of the holder bodies 121 are adjacent to the second container body 820 with a small gap therebetween (or in contact with the second container body 820). If the holder device 12 is lowered beyond the lower limit, the extension sections 121*b* of the holder bodies 121 may come into strong contact with the second container body 820, which may result in a transfer error. Therefore, the control device C causes the lift device 13 to stop lowering the holder device 12 in response to the second sensor 142*s* detecting that the holder device 12 is located at the lower limit.

The second sensor 142*s* of this embodiment includes a lower light emitter-receiver Sd2 and an upper light emitter-receiver Su2 disposed above the lower light emitter-receiver Sd2. It is detected that the second detector body 142*a* is in the positioning recessed section 801*c* (detection target section T) based on whether or not the optical axis is blocked at the lower light emitter-receiver Sd2. It is detected that the holder device 12 is located at the lower limit based on whether or not the optical axis is blocked at the upper light emitter-receiver Su2. In this example, a portion of the second detector body 142*a* blocks the optical axis of the upper light emitter-receiver Su2 when the protrusion amount of the second detector body 142*a* relative to the interior of the holder main body 120 reaches a predetermined set amount. The aforementioned set amount is determined as appropriate depending on the relationship between the second detector body 142*a* and the lower limit of the holder device 12.

Thus, the control device C determines that the target container 80 is the second container 82 and detects that the holder device 12 is located at the lower limit relative to the second container 82, with use of the second detector 142.

In this embodiment, one of the four positioning sections 122 of the holder device 12 serves as the second detector body 142*a*. If the target container 80 is the second container 82, the second detector body 142*a* is fitted into a positioning recessed section 801*c* (detection target section T) of the second held sections 821. In this example, of the four positioning sections 122, the positioning section 122 disposed at a position diagonal to the second detector body 142*a* as viewed in the up-down direction is fitted into a positioning recessed section 801*c* in the second held section 821 different from the second held section 821 that has the positioning recessed section 801*c* (detection target section T) into which the second detector body 142*a* is fitted, as shown in FIG. 7(*a*). That is, the holder device 12 is positioned relative to the second container 82 by two positioning sections 122 that are diagonal to each other as viewed in the up-down direction, of the four positioning sections 122. One of these two positioning sections 122 serves as the second detector body 142*a* and detects that the target container 80 is the second container 82.

If it is determined that the target container 80 is the second container 82, the control device C causes the holder drive mechanism 12*m* to move the two holder bodies 121 away from each other until the distance therebetween corresponds to the second distance L2. As a result, the extension sections 121*b* of the pair of holder claws 121C are disposed below the plate-shaped sections 801*b* of the pair of second held sections 821.

After moving the two holder bodies 121 away from each other until the distance therebetween corresponds the second distance L2, the control device C causes the lift device 13 to raise the holder device 12. The pair of holder bodies 121 thus raises the pair of second held sections 821 from below. Then the holder device 12 completes holding of the second container 82.

In this embodiment, while the holder device 12 is holding the pair of second held sections 821 of the second container 82, the first detector 141 does not detect the detection target section T of the second held sections 821, and the second detector 142 detects the detection target section T of the second held sections 821. This allows the determination device 14 to determine that the target container 80 is the second container 82, even while the holder device 12 is holding the target container 80. Accordingly, it is always possible to reference the determination results obtained by the determination device 14 while the holder device 12 is holding the target container 80 without the need to store the type of the held container 80 after the holder device 12 holds the target container 80. These determination results can be used, for example, for a transport operation to transport the target container 80, a lifting operation to raise and lower the target container 80, and a releasing operation to release the held target container 80.

According to the above-described transport vehicle 1, it is possible to determine the types of containers 80 and hold containers 80 of different types.

Other Embodiments

Next, other embodiments of the transport vehicle will be described.

Figure 8:
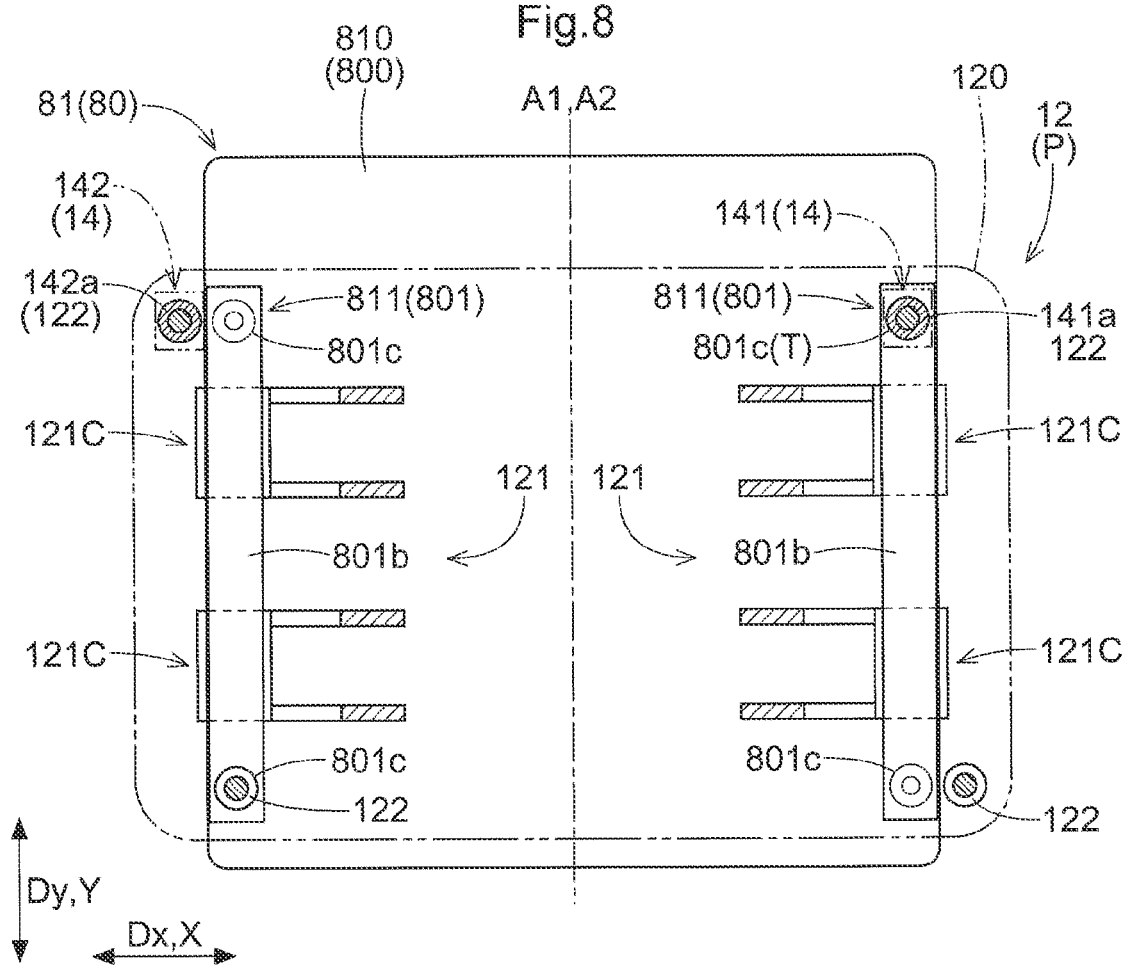
FIG. 8 shows a determination device according to another embodiment.

(1) In the above embodiment, an example has been described where the first detector 141 and the second detector 142 are disposed on the same side in the holding operation direction (first direction X) relative to the central position A1 between the two holder bodies 121 serving as a reference. However, the present invention is not limited to such an example. The first detector 141 and the second detector 142 may alternatively be disposed on opposite sides in the holding operation direction (first direction X) relative to the central position A1 between the two holder bodies 121 serving as a reference, as shown in FIG. 8. Note that, in the shown example, the first detector 141 and the second detector 142 are disposed at the same position in the second direction Y (a direction orthogonal to the holding operation direction as viewed in the up-down direction). However, the first detector 141 and the second detector 142 may alternatively be disposed at different positions in the second direction Y.

Figure 9:
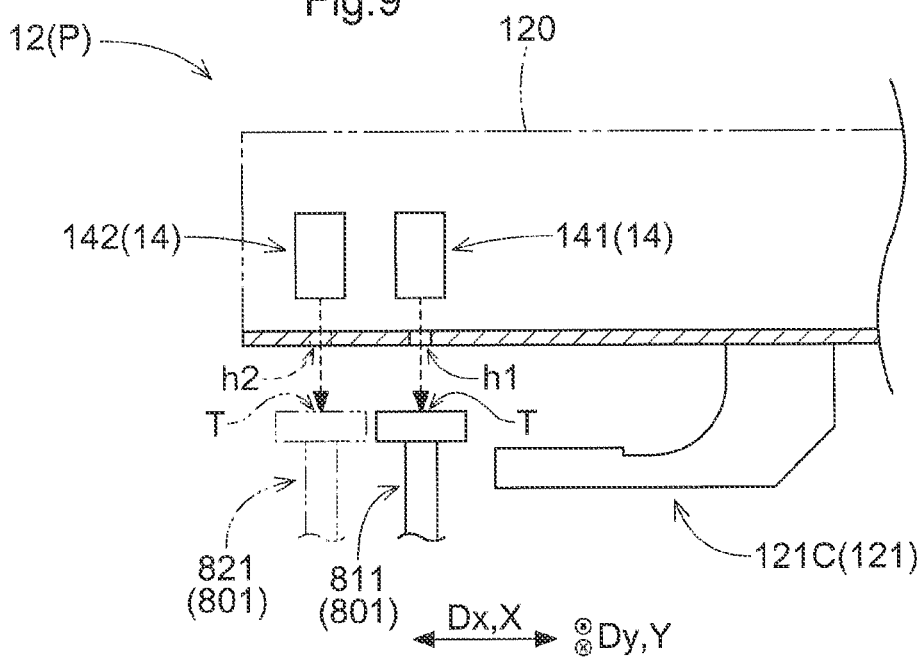
FIG. 9 shows a determination device according to another embodiment.

(2) In the above embodiment, an example has been described where the first detector 141 includes a first detector body 141*a* and a first sensor 141*s* that detects up-down movement of the first detector body 141*a*, and the second detector 142 includes a second detector body 142*a* and a second sensor 142*s* that detects up-down movement of the second detector body 142*a*. However, the present invention is not limited to such an example. For example, the first detector 141 may alternatively be constituted by an optical sensor that detects a first held section 811 by projecting light through a hole section h1 of the holder main body 120, as shown in FIG. 9. Also, the second detector 142 may alternatively be constituted by an optical sensor that detects a second held section 821 by projecting light through a hole section h2 of the holder main body 120.

(3) In the above embodiment, an example has been described where the detection target sections T are the positioning recessed sections 801*c* provided in the upper faces of the first held sections 811 and the second held sections 821. However, the present invention is not limited to this example. The detection target section T need only be a portion of the first held sections 811 and the second held sections 821, and may be, for example, any of the upper faces themselves of the first held sections 811 and the second held sections 821. Alternatively, the detection target section T may be some or all of separate members attached to the first held section 811 and the second held section 821.

(4) In the above embodiment, an example has been described where the two holder bodies 121 are configured to hold the pair of held sections 801 from the inner side in the arrangement direction Dx by moving away from each other in the holding operation direction (first direction X) between the pair of target held sections 801. However, the present invention is not limited to such an example. The two holder bodies 121 may alternatively be disposed on the outer side of the pair of target held sections 801 in the arrangement direction Dx and configured to hold the pair of held sections 801 from the outer side in the arrangement direction Dx by approaching each other in the holding operation direction. In this case, the control device C lowers the holder device 12 to the holding reference position P such that the two holder bodies 121 are disposed on the outer side of the pair of target held sections 801 in the arrangement direction Dx, and that the holding operation direction (first direction X) is parallel with the arrangement direction Dx in which the two target held sections 801 are arranged. Thereafter, the control device C moves the two holder bodies 121 closer to each other in the holding operation direction (first direction X).

(5) In the above embodiment, an example has been described where the plurality of types of containers 80 include the first container 81 and the second container 82. The plurality of types of containers 80 may also include any other type of container 80 than the first container 81 and the second container 82. In this case, it is favorable that the determination device 14 includes detectors in one-to-one correspondence with the types of containers 80, in addition to the first detector 141 and the second detector 142.

(6) Note that the configuration disclosed in the above embodiment can also be applied in combination with configurations disclosed in other embodiments as long as no contradiction arises. Regarding other configurations as well, the embodiment disclosed herein is merely an example in all respects. Accordingly, various modifications can be made as appropriate without departing from the gist of the present disclosure.

Summary of Above Embodiment

The above-described article transport vehicle will be described below.

A transport vehicle configured to travel along a travel path and transport a plurality of types of containers including a first container and a second container, includes:
  a holder device configured to hold a container, of the plurality of containers;
  a lift device configured to raise and lower the holder device; and
  a determination device configured to determine a type of the container held by the holder device,
  wherein each of the plurality of containers includes a container body and a pair of held sections protruding upward from an upper face of the container body and configured to be held by the holder device,
  the first container includes a first container body serving as the container body, and a pair of first held sections serving as the pair of held sections,
  the second container includes a second container body serving as the container body, and a pair of second held sections serving as the pair of held sections,
  at least one of the two first held sections includes a detection target section, and at least one of the two second held sections includes a detection target section,
  the two first held sections are spaced apart from each other in a direction parallel with an upper face of the first container body by a first distance, the two second held sections are spaced apart from each other in a direction parallel with an upper face of the second container body by a second distance, and the first distance is smaller than the second distance,
  the determination device includes a first detector and a second detector,
  the first detector is attached to the holder device and configured to, while the holder device is at a holding reference position, detect the detection target section of the at least one of the two first held sections and not detect the detection target section of the at least one of the two second held sections, and
  the second detector is attached to the holder device and configured to, while the holder device is at the holding reference position, detect the detection target section of the at least one of the two second held sections and not detect the detection target section of the at least one of the two first held sections,
  the holding reference position being a relative position of the holder device with respect to a target container, which is a container that is to be held, and the holding reference position serving as a reference for the holder device to start a holding operation for the target container.

According to this configuration, it is possible to determine that the target container is the first container in response to the first detector detecting the detection target section in the first held sections while the holder device is disposed at the holding reference position. Also, it is possible to determine that the target container is the second container in response to the second detector detecting the detection target section in the second held sections while the holder device is disposed at the holding reference position. If it is determined that the target container is the first container, the transport vehicle can appropriately hold the first container by performing a holding operation corresponding to the first distance, which is the distance between the two first held sections. If it is determined that the target container is the second container, the transport vehicle can appropriately hold the second container by performing a holding operation corresponding to the second distance, which is the distance between the two second held sections. As described above, according to this configuration, it is possible to realize a transport vehicle capable of determining the types of different types of containers and holding the different types of containers.

It is preferable that the transport vehicle further includes a control device configured to control the holder device and the lift device,
  wherein the holder device includes:
    a pair of holder bodies; and
    a holder drive mechanism configured to move the two holder bodies closer to and farther away from each other in a holding operation direction, which is parallel with a horizontal direction, and
  the control device is configured to, so as to cause the holder device to hold the target container supported by a support section below the travel path, (i) lower the holder device to the holding reference position such that the pair of holder bodies is disposed between a pair of target held sections, which is the pair of held sections of the target container, and such that the holding operation direction is parallel with an arrangement direction, which is a direction in which the two target held sections are next to each other; (ii) cause the determination device to determine the type of the target container, (iii) cause the holder drive mechanism to move the two holder bodies away from each other until the distance therebetween corresponds to the first distance, in response to the determination device determining that the target container is the first container, or cause the holder drive mechanism to move the two holder bodies away from each other until the distance therebetween corresponds to the second distance, in response to the determination device determining that the target container is the second container, and (iv) cause the lift device to raise the holder device after moving the two holder bodies away from each other until the distance therebetween corresponds to the first distance or the second distance.

According to this configuration, the pair of holder bodies is disposed between the pair of target held sections while the holder device is located at the holding reference position. The target container can be held by moving the two holder bodies away from each other until the distance therebetween corresponds to the distance between the two target held sections. That is, according to this configuration, the pair of target held sections can be held from the inner side in the arrangement direction. Accordingly, for example, the holder device can be downsized in the arrangement direction compared to a configuration in which the pair of target held sections are held from the outer side in the arrangement direction.

It is preferable that while the holder device is holding the pair of first held sections of the first container, the first detector detects the detection target section of the at least one of the two first held sections, and the second detector does not detect the detection target section of the at least one of the two first held sections, and while the holder device is holding the pair of second held sections of the second container, the first detector does not detect the detection target section of the at least one of the two second held sections, and the second detector detects the detection target section of the at least one of the two second held sections.

According to this configuration, the determination device can determine whether the target container is the first container or the second container, even while the holder device is holding the target container. Accordingly, it is always possible to reference the determination results obtained by the determination device while the holder device is holding the target container without the need to store the type of the held container after the holder device holds the target container. These determination results can be used, for example, for a transport operation to transport the target container, a lifting operation to raise and lower the target container, and a releasing operation to release the held target container.

It is preferable that the detection target section of the at least one of the two first held sections is a positioning recessed section of an upper face of the at least one of the two first held sections, and the detection target section of the at least one of the two second held sections is a positioning recessed section of an upper face of the at least one of the two second held sections, the first detector includes a first detector body supported in such a manner as to be movable in an up-down direction relative to the holder device, and a first sensor configured to detect up-down movement of the first detector body, the second detector includes a second detector body supported in such a manner as to be movable in the up-down direction relative to the holder device, and a second sensor configured to detect up-down movement of the second detector body, while the holder device is at the holding reference position, the first detector body is fitted into the positioning recessed section of the at least one of the two first held sections from above and not in contact with the second held sections, while the holder device is at the holding reference position, the second detector body is fitted into the positioning recessed section of the at least one of the two second held sections from above and not in contact with the first held sections, the holder device is positioned relative to the first held sections by the first detector body being fitted into the positioning recessed section, the holder device is positioned relative to the second held sections by the second detector body being fitted into the positioning recessed section, the first sensor detects whether or not the first detector body is in the positioning recessed section based on the up-down movement of the first detector body, the first detector detects the detection target section of the at least one of the two first held sections in response to the first sensor detecting that the first detector body is in the positioning recessed section, the second sensor detects whether or not the second detector body is in the positioning recessed section based on the up-down movement of the second detector body, and the second detector detects the detection target section of the at least one of the two second held sections in response to the second sensor detecting that the second detector body is in the positioning recessed section.

According to this configuration, it is possible to not only determine the first container but also position the holder device relative to the first held sections with use of the first detector body. Further, it is possible to not only determine the second container but also position the holder device relative to the second held sections with use of the second detector body. Thus, according to this configuration, the first and second detector bodies having the functions of determining the container type and positioning the holder device enables reduction in the number of members and facilitates downsizing of the device.

INDUSTRIAL APPLICABILITY

The technology according to the present disclosure can be used in a transport vehicle that travels along a travel path and transports a plurality of types of containers including a first container and a second container.

What is claimed is:

1. A transport vehicle configured to travel along a travel path and transport a plurality of types of containers comprising a first container and a second container, the transport vehicle comprising:
a holder device configured to hold a container of the plurality of containers;
a lift device configured to raise and lower the holder device; and
a determination device configured to determine a type of the container held by the holder device, and wherein:
each of the plurality of containers comprises a container body and a pair of held sections protruding upward from an upper face of the container body and configured to be held by the holder device,
the first container comprises a first container body serving as the container body, and a pair of first held sections serving as the pair of held sections,
the second container comprises a second container body serving as the container body, and a pair of second held sections serving as the pair of held sections,
at least one of the two first held sections comprises a detection target section, and at least one of the two second held sections comprises a detection target section,
the two first held sections are spaced apart from each other in a direction parallel with an upper face of the first container body by a first distance, the two second held sections are spaced apart from each other in a direction parallel with an upper face of the second container body by a second distance, and the first distance is smaller than the second distance,
the determination device comprises a first detector and a second detector,
the first detector is attached to the holder device and configured to, while the holder device is at a holding reference position, detect the detection target section of the at least one of the two first held sections and not detect the detection target section of the at least one of the two second held sections, and
the second detector is attached to the holder device and configured to, while the holder device is at the holding reference position, detect the detection target section of the at least one of the two second held sections and not detect the detection target section of the at least one of the two first held sections,
the holding reference position is a relative position of the holder device with respect to a target container, which is a container that is to be held, and the holding reference position serving as a reference for the holder device to start a holding operation for the target container.

2. The transport vehicle according to claim 1, further comprising:
a control device configured to control the holder device and the lift device, and
wherein the holder device comprises:
  a pair of holder bodies; and
  a holder drive mechanism configured to move the two holder bodies closer to and farther away from each other in a holding operation direction, which is parallel with a horizontal direction, and
wherein the control device is configured to, so as to cause the holder device to hold the target container supported by a support section below the travel path:
  lower the holder device to the holding reference position such that the pair of holder bodies is disposed between a pair of target held sections, which is the pair of held sections of the target container, and such that the holding operation direction is parallel with an arrangement direction, which is a direction in which the two target held sections are next to each other;
  cause the determination device to determine the type of the target container;
  cause the holder drive mechanism to move the two holder bodies away from each other until the distance therebetween corresponds to the first distance, in response to the determination device determining that the target container is the first container, or cause the holder drive mechanism to move the two holder bodies away from each other until the distance therebetween corresponds to the second distance, in response to the determination device determining that the target container is the second container; and
  cause the lift device to raise the holder device after moving the two holder bodies away from each other until the distance therebetween corresponds to the first distance or the second distance.

3. The transport vehicle according to claim 1,
wherein while the holder device is holding the pair of first held sections of the first container, the first detector detects the detection target section of the at least one of the two first held sections, and the second detector does not detect the detection target section of the at least one of the two first held sections, and
wherein while the holder device is holding the pair of second held sections of the second container, the first detector does not detect the detection target section of the at least one of the two second held sections, and the second detector detects the detection target section of the at least one of the two second held sections.

4. The transport vehicle according to claim 1, wherein:
the detection target section of the at least one of the two first held sections is a positioning recessed section of an upper face of the at least one of the two first held sections, and the detection target section of the at least one of the two second held sections is a positioning recessed section of an upper face of the at least one of the two second held sections,
the first detector comprises a first detector body supported in such a manner as to be movable in an up-down direction relative to the holder device, and a first sensor configured to detect up-down movement of the first detector body,
the second detector comprises a second detector body supported in such a manner as to be movable in the up-down direction relative to the holder device, and a second sensor configured to detect up-down movement of the second detector body,
while the holder device is at the holding reference position, the first detector body is fitted into the positioning recessed section of the at least one of the two first held sections from above and not in contact with the second held sections,
while the holder device is at the holding reference position, the second detector body is fitted into the positioning recessed section of the at least one of the two second held sections from above and not in contact with the first held sections,
the holder device is positioned relative to the first held sections by the first detector body being fitted into the positioning recessed section,
the holder device is positioned relative to the second held sections by the second detector body being fitted into the positioning recessed section,
the first sensor detects whether or not the first detector body is in the positioning recessed section based on the up-down movement of the first detector body,
the first detector detects the detection target section of the at least one of the two first held sections in response to the first sensor detecting that the first detector body is in the positioning recessed section, the second sensor detects whether or not the second detector body is in the positioning recessed section based on the up-down movement of the second detector body, and the second detector detects the detection target section of the at least one of the two second held sections in response to the second sensor detecting that the second detector body is in the positioning recessed section.

* * * * *